(12) United States Patent
Clark

(10) Patent No.: US 8,058,893 B1
(45) Date of Patent: *Nov. 15, 2011

(54) FREQUENCY TRIMMING FOR INTERNAL OSCILLATOR FOR TEST-TIME REDUCTION

(75) Inventor: Paul G. Clark, Redmond, WA (US)

(73) Assignee: IXYS CH GmbH (CH)

( * ) Notice: Subject to any disclaimer, the term of this patent is extended or adjusted under 35 U.S.C. 154(b) by 0 days.

This patent is subject to a terminal disclaimer.

(21) Appl. No.: 12/927,843

(22) Filed: Nov. 27, 2010

Related U.S. Application Data

(63) Continuation of application No. 11/701,137, filed on Jan. 31, 2007, now Pat. No. 7,852,099.

(51) Int. Cl.
*G01R 31/26* (2006.01)
*G01R 31/02* (2006.01)

(52) U.S. Cl. ........... 324/762.02; 324/750.3; 324/757.04; 702/106; 702/108; 327/291; 714/724

(58) Field of Classification Search ............... 324/750.3, 324/760.01–762.02, 750.03–750.09
See application file for complete search history.

(56) References Cited

U.S. PATENT DOCUMENTS

| | | | |
|---|---|---|---|
| 5,729,151 A * | 3/1998 | Zoerner et al. | 324/750.3 |
| 6,448,800 B1 | 9/2002 | Yamamoto et al. | 324/763 |
| 6,606,575 B2 | 8/2003 | Miller | 702/104 |
| 6,674,318 B2 | 1/2004 | Kanda et al. | 327/540 |
| 6,804,620 B1 | 10/2004 | Larson et al. | 702/91 |
| 7,036,061 B2 | 4/2006 | Muhtaroglu | 714/727 |
| 7,049,797 B2 | 5/2006 | Fukui et al. | 323/281 |
| 7,243,036 B2 | 7/2007 | Boeh | 702/106 |
| 2002/0153917 A1 | 10/2002 | Tanaka et al. | 324/765 |
| 2007/0205830 A1 | 9/2007 | Itagaki et al. | 331/2 |
| 2007/0288817 A1 | 12/2007 | Tanaka et al. | 714/724 |

* cited by examiner

*Primary Examiner* — Huy Q Phan
*Assistant Examiner* — Emily Chan
(74) *Attorney, Agent, or Firm* — Imperium Patent Works; Zheng Jin; Darien K. Wallace

(57) ABSTRACT

An internal precision oscillator (IPO) is trimmed within a microcontroller integrated circuit. The microcontroller integrated circuit receives a test program into flash memory on the microcontroller integrated circuit from a tester. The microcontroller integrated circuit also receives a reference signal from the tester. The IPO generates a clock signal having a frequency that depends upon a trim value. A general purpose timer on the microcontroller integrated circuit counts the number of cycles of the clock signal during a time period defined by the reference signal and outputs a digital value. A processor on the microcontroller integrated circuit executes the test program, reads the digital output, and adjusts the trim value such that the frequency of the clock signal is calibrated with respect to the reference signal. Test-time on the tester is reduced because the decision making during the frequency trimming process is made by the processor instead of the tester.

17 Claims, 4 Drawing Sheets

PSEUDO CODE FOR TIMER:

```
WHILE (REFERENCE PULSE == HIGH)
{
    COUNT = 0;

IF (CLOCK SIGNAL CLK RISES)
    {
        COUNT ++;
    }

}
```

FREQUENCY TRIMMING FOR INTERNAL OSCILLATOR FOR TEST-TIME REDUCTION

CROSS REFERENCE TO RELATED APPLICATION

This application is a continuation of, and claims priority under 35 U.S.C. §120 from, nonprovisional U.S. patent application Ser. No. 11/701,137 entitled "Frequency Trimming For Internal Oscillator For Test-Time Reduction," filed on Jan. 31, 2007, now U.S. Pat. No. 7,852,099, the subject matter of which is incorporated herein by reference.

TECHNICAL FIELD

The disclosed embodiments relate to frequency trimming of on-chip oscillators for Device Under Test (DUT) test-time reduction.

BACKGROUND

External crystal oscillators and internal precision oscillators (IPOs) are used to provide clock signals for many electronic circuits and applications. Although an external crystal oscillator provides an accurate oscillation frequency, a crystal oscillator is usually more expensive and less reliable. Therefore, an internal precision oscillator (IPO) is sometimes preferred over an external crystal oscillator. However, IPOs are implemented on semiconductor chips (known as Integrated Circuits) and could generate inaccurate oscillation frequencies due to production-related parameter fluctuations (i.e., process, voltage and temperature variations). For systems or inter-system communications that require a high precision target frequency, an IPO generally needs to be tested such that it generates an oscillation frequency that is substantially equal to the target frequency. Commonly, the oscillation frequency of an IPO is dependant upon a trim value representing either resistance or capacitance within the IPO. During the testing process (also known as trimming), the oscillation frequency is calibrated with respect to the target frequency by adjusting the trim value.

FIG. 1 (prior art) is a diagram of a microcontroller integrated circuit 1 and a production tester 2 (Teradyne J750 as illustrated). Microcontroller integrated circuit 1 includes a RC IPO 3, an on-chip debugger 4, a trim register 5, and a parallel data bus 6. Microcontroller integrated circuit 1 also includes terminal 7 and terminal 8. RC IPO 3 generates a clock signal that is output onto terminal 7. Tester 2 receives the clock signal from terminal 7. Tester 2 has a serial port 9. Serial port 9 of tester 2 is connected to terminal 8 of microcontroller integrated circuit 1 for serial communication.

FIG. 1 illustrates an example of a frequency trimming method for RC IPO 3 using production tester 2. In the example of FIG. 1, the frequency of the clock signal is dependant upon a 10-bit trim value that is stored in trim register 5. Tester 2 receives the clock signal and measures the frequency of the clock signal. Tester 2 then compares the measured frequency with a desirable target frequency (for instance, a frequency of 5.5296 MHz). If the measured frequency is different from 5.5296 MHz, then tester 2 sends out a new 10-bit trim value in serial digital format through serial port 9. On-chip debugger 4 receives the new trim value from terminal 8 in serial digital format and converts the new trim value to parallel format. On-chip debugger 4 then writes the new trim value into trim register 5 across parallel bus 6. RC IPO 3 then generates a clock signal with a different frequency that is closer to 5.5296 MHz due to the new trim value. Tester 2 measures the new frequency of the clock signal and repeats the same trimming process until the frequency of the clock signal is substantially equivalent to the target frequency of 5.5296 MHz.

This frequency trimming process for RC IPO 3 using tester 2 is performed for each chip individually and is time consuming. Extra cost and test latency is introduced for a number of reasons. First, a regular tester is usually designed for sending predefined inputs and checking predefined outputs. In order to measure frequency and make a decision in adjusting the trim value, tester 2 is more intelligent and therefore more expensive than a regular tester. Second, sending the new trim value in serial digital format through serial communication is slow. Third, tester 2 is occupied throughout the entire trimming process because it uses its serial port to communicate to microcontroller integrated circuit 1 through debug terminal 8. As a result, tester 2 may not be able to perform other tests during the frequency trimming process. The large amount of test time required to trim RC IPO 3 adds to the total cost of microcontroller integrated circuit 1. Therefore, it is desirable to reduce the amount of test time required to trim RC IPO 3.

SUMMARY

An on-chip oscillator is trimmed internally within the microcontroller integrated circuit. In one embodiment, the microcontroller integrated circuit receives a test program into a flash memory of the microcontroller integrated circuit from a tester. The microcontroller integrated circuit also receives a reference signal from the tester. The on-chip oscillator on the microcontroller integrated circuit generates a clock signal with a clock frequency that depends upon a trim value stored in a trim register. A general purpose timer on the microcontroller integrated circuit counts the number of cycles of the clock signal during a time period defined by the reference signal and outputs a digital count. A processor on the microcontroller integrated circuit executes the test program, reads the digital count, and adjusts the trim value accordingly. The frequency of the clock signal is adjusted from time period to time period of the reference signal until the frequency of the clock signal is calibrated with respect to the reference signal. The final trim value is then saved in a predetermined memory location of the flash memory. Finally, the processor sends a DONE signal to the tester, and the test program is erased from the flash memory before the microcontroller integrated circuit is taken off the tester.

In another embodiment, a microcontroller integrated circuit is a device-under-test (DUT) to be tested by a tester. An on-chip oscillator on the microcontroller integrated circuit generates a clock signal to be tested and calibrated with respect to a target frequency. The frequency of the clock signal is trimmed internally within the DUT using the same internal frequency trimming method as described above. This internal frequency trimming method reduces the testing and trimming time because the decision making during the frequency trimming process is made by the processor instead of the tester. The tester is also able to perform other parallel tests on the microcontroller integrated circuits during the frequency trimming process.

Another advantage of this internal frequency trimming method is that the tester is no longer required to measure the frequency of the clock signal and do decision-making and therefore can be less expensive than an intelligent tester like the Teradyne J750.

In another embodiment, a method includes receiving a reference signal and a program from a tester onto a microcontroller integrated circuit. An internal precision oscillator (IPO) is used to generate a clock signal, and a timer is used to generate a count of a number of cycles of the clock signal that occur during a period of time defined by the reference signal. The program is executed on the processor such that the processor repeats a process of reading the count and adjusting the trim value based on the count such that the frequency of the clock signal is adjusted from pulse to pulse of the reference signal and such that the frequency of the clock signal is calibrated with respect to the reference signal. A trim value is written into non-volatile memory on the microcontroller, and the program is erased from the memory. The aforementioned steps occur while the microcontroller is coupled to the tester.

The method also includes automatically reading the trim value out of the non-volatile memory upon a power-up condition of the microcontroller when the microcontroller is not coupled to the tester, and using the trim value to set a frequency of a clock signal generated by the IPO after the power-up condition. The timer is a general purpose timer that is usable by a user to time pulses received onto a terminal of the microcontroller integrated circuit.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
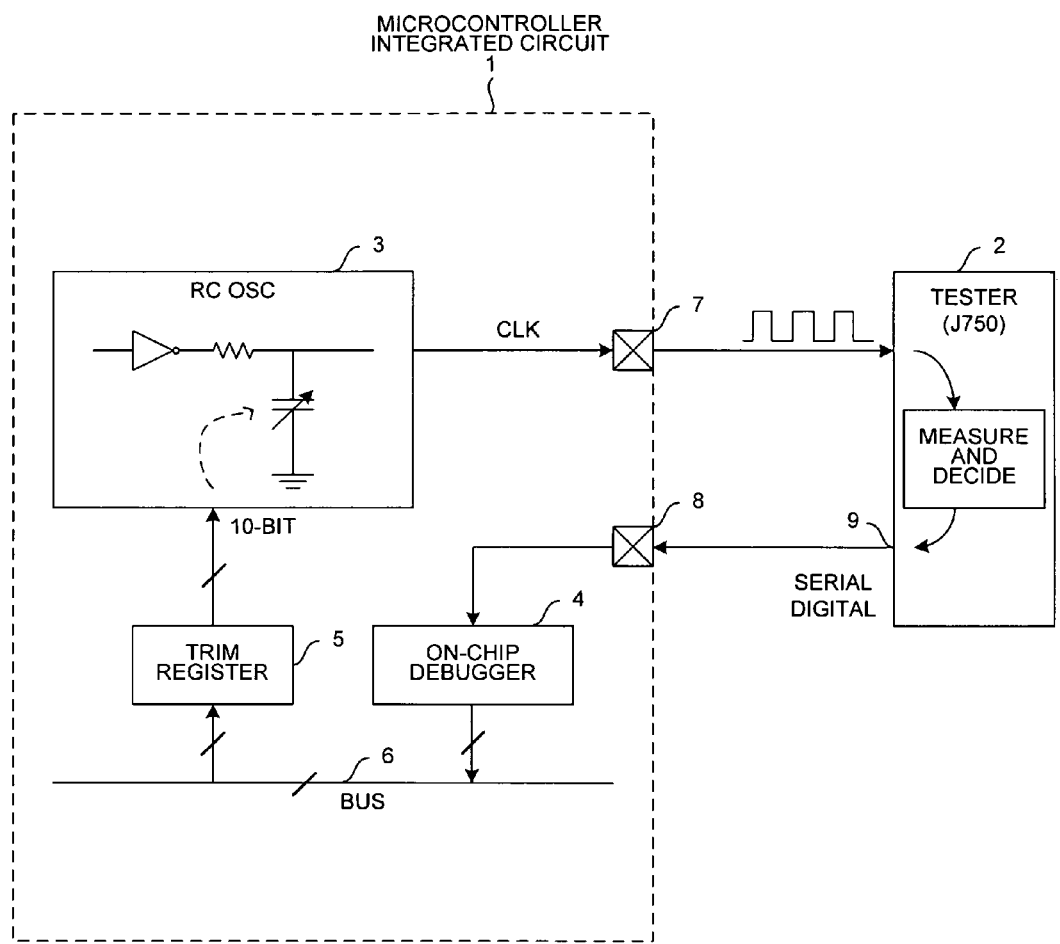
FIG. 1 (prior art) illustrates an example of a conventional frequency trimming method for a RC oscillator using a production tester.
Figure 2:
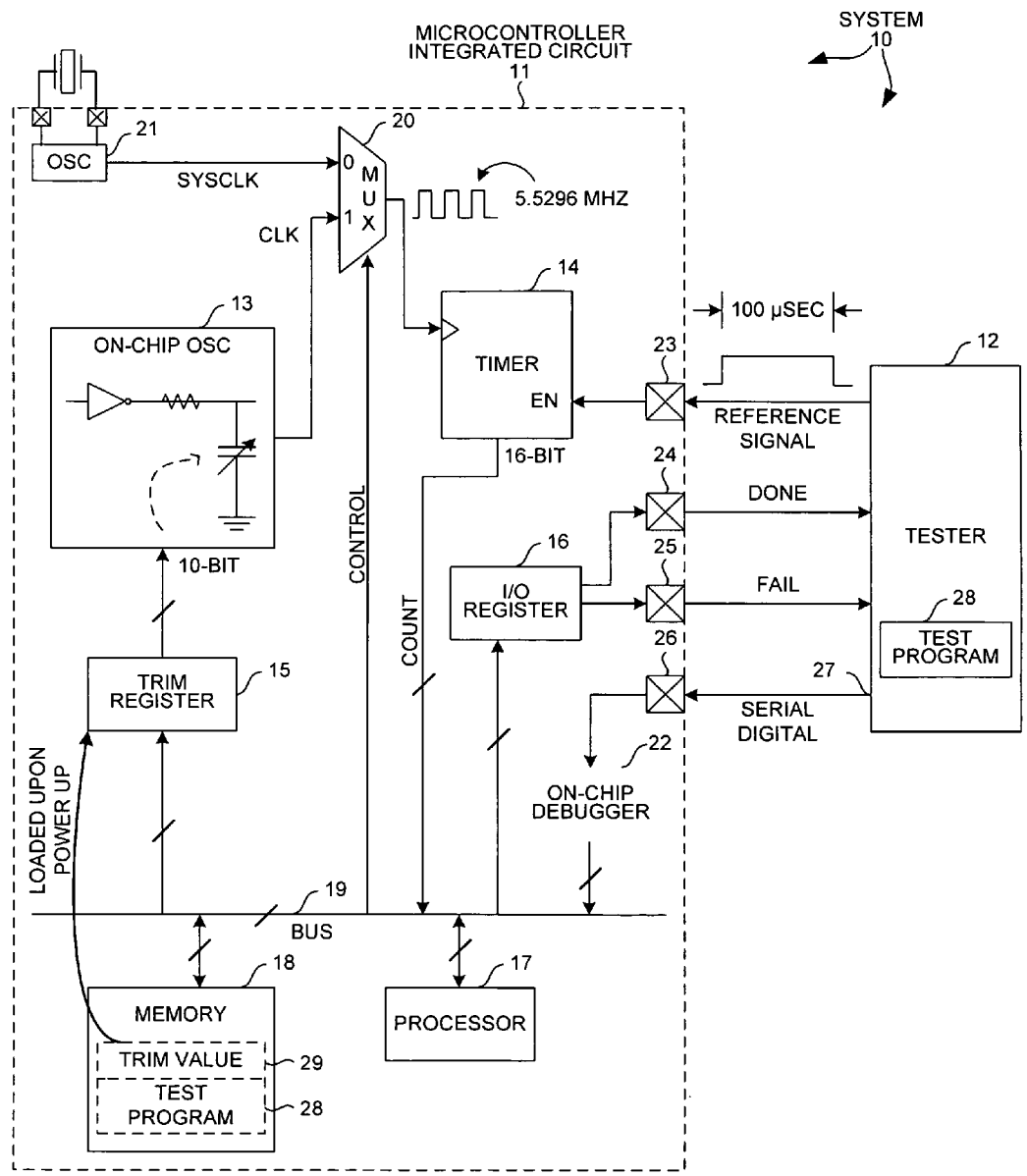
FIG. 2 is a diagram of a system in accordance with one novel aspect.

FIG. 2 is a diagram of a system 10 in accordance with one novel aspect. System 10 includes a microcontroller integrated circuit 11 and a production tester 12. Microcontroller integrated circuit 11 is also a device under test (DUT) to be tested by production tester 12. Microcontroller integrated circuit 11 includes an on-chip oscillator 13 (also referred to as an Internal Precision Oscillator or "IPO") and a general purpose timer 14. On-chip oscillator 13 generates a clock signal output CLK. Clock signal CLK is coupled to the clock input lead of timer 14 through a multiplexer 20. Tester 12 supplies a fixed reference signal onto a terminal 23 of microcontroller integrated circuit 11. Terminal 23 is coupled to the ENABLE input lead (EN) of timer 14. Microcontroller integrated circuit 11 also includes a trim register 15, an input/output (I/O) register 16, a processor 17, flash memory 18, and a parallel bus 19 for internal data access and communication. Processor 17 can read the output of timer 14 and write to trim register 15 and I/O register 16 across bus 19. In addition, microcontroller integrated circuit 11 includes an external crystal oscillator 21, an on-chip debugger 22, a debugger terminal 26, and I/O terminals 24 and 25. A serial port 27 of tester 12 is connected to debugger terminal 26 of microcontroller integrated circuit 11 for serial communication. Tester 12 also receives signals from I/O terminals 24 and 25 of microcontroller integrated circuit 11.

Figure 3:
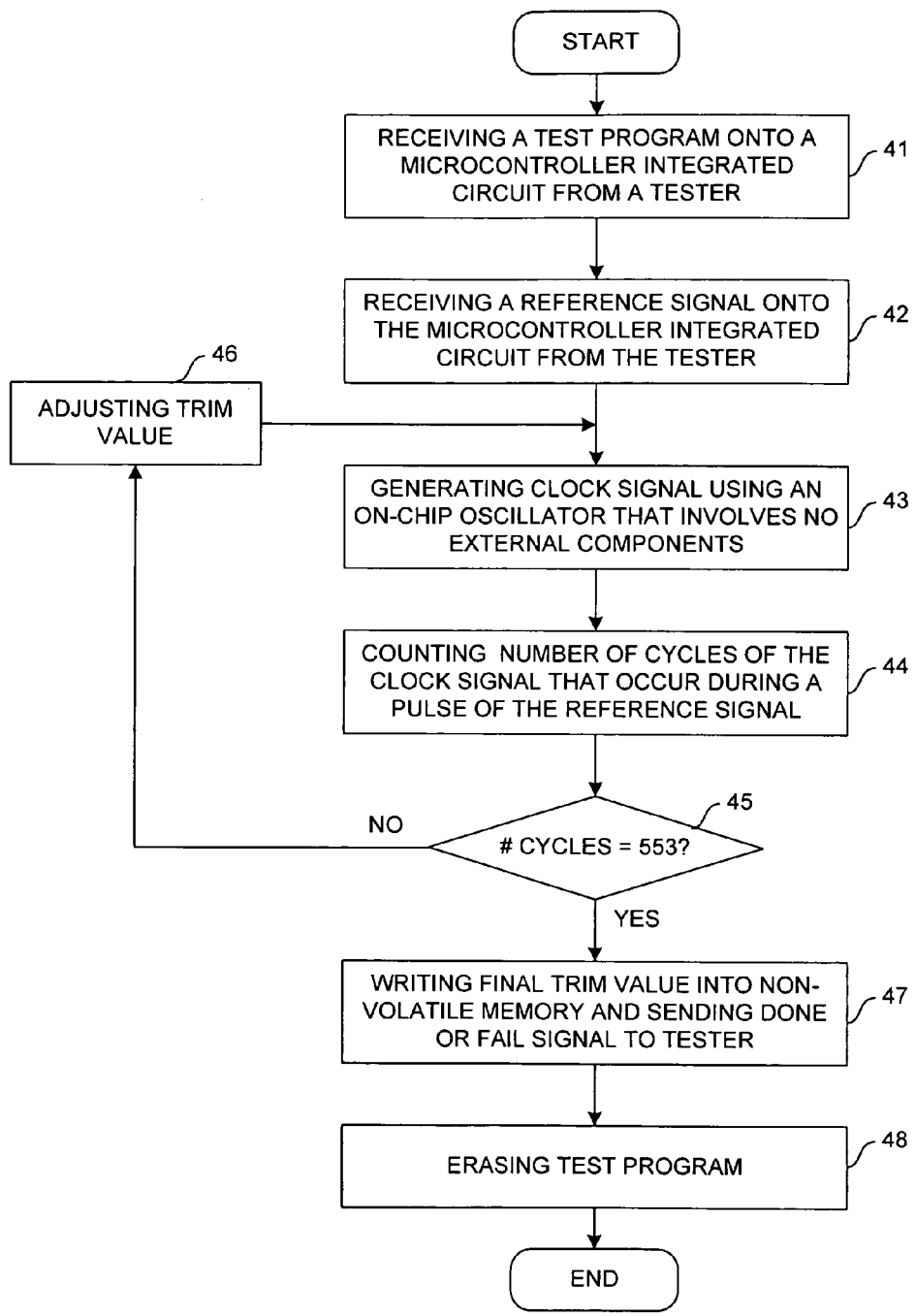
FIG. 3 is a flowchart of an internal frequency trimming method for a RC oscillator.

FIG. 3 is a flowchart of a frequency trimming method in accordance with one novel aspect. Initially, DUT 11 receives (step 41) a test program 28 and loads it into flash memory 18. Test program 28 is sent in serial digital format from serial port 27 of tester 12. On-chip debugger 22 receives test program 28 in serial digital format from debugger terminal 26 and converts test program 28 to parallel format. On-chip debugger 22 then writes test program 28 into flash memory 18 across parallel bus 19. Processor 17 starts executing test program 28 after test program 28 has been successfully loaded into flash memory 18. DUT 11 also receives (step 42) a reference signal (for instance, a square wave of pulses with a pulse width of 100 microseconds as illustrated) onto the enable input lead EN of timer 14 through terminal 23.

On-chip oscillator 13 generates (step 43) a clock signal output CLK. Processor 17 executes test program 28 and sends a CONTROL value to the select input lead of multiplexer 20 such that the data input lead 1 of multiplexer 20 is selected. Clock signal CLK is then coupled to the clock input lead of timer 14 through multiplexer 20. Timer 14 then counts (step 44) the number of pulses of clock signal CLK during a period of time defined by the reference signal (for instance, 100 microseconds as illustrated). An example of a period of time defined by the reference signal is a pulse of the reference signal. Timer 14 is a general purpose timer. External crystal oscillator 21 is an oscillator sometimes used to provide an alternate system clock SYSCLK. If SYSCLK is selected to be the system clock source, then processor 17 sends a different CONTROL value to the select input lead of multiplexer 20 such that the data input lead 0 of multiplexer 20 is selected. SYSCLK is then coupled to the clock input lead of timer 14.

Figures 4, 5:
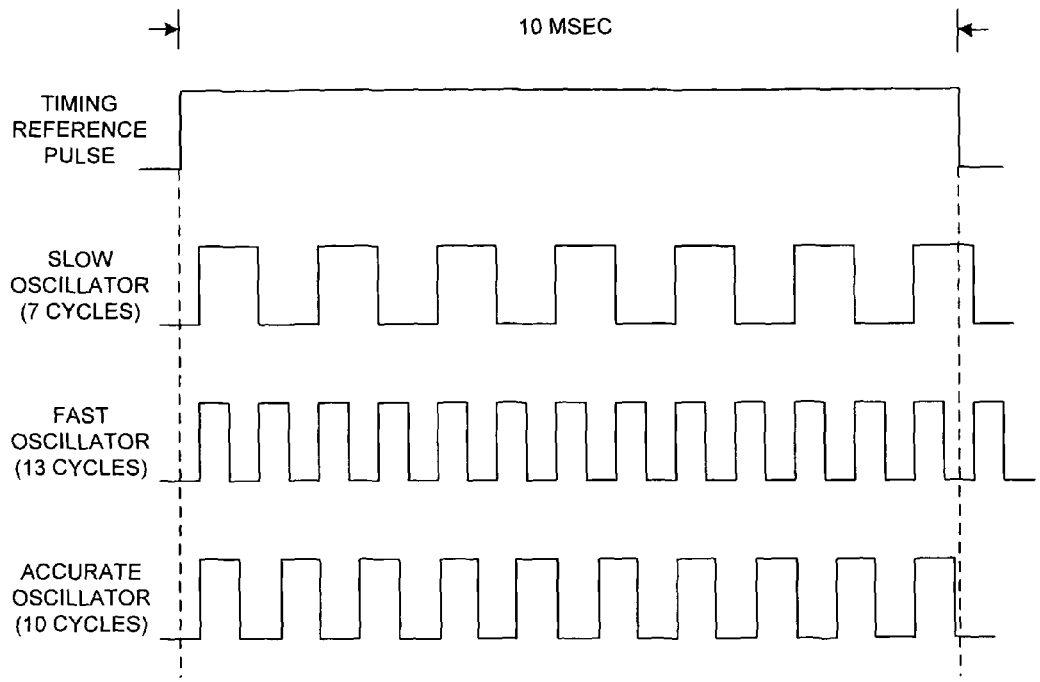
FIG. 4 is a diagram of a reference pulse and some oscillation signals with different frequencies.
FIG. 5 is an example of a software implementation of a frequency counter.

FIG. 4 illustrates an example of measuring an oscillation frequency using timer 14. In the example of FIG. 4, the target oscillation frequency is 1000 Hz and the width of the reference pulse is ten milliseconds. Because the reference pulse is connected to the enable input lead of counter 14, counter 14 is enabled and starts to count the number of cycles of clock signal CLK when the reference pulse goes high. Counter 14 stops counting when the reference pulse goes low. If the oscillation frequency of clock signal CLK is accurate, then the number of cycles counted during ten milliseconds is equal to ten. If the number of cycles within ten milliseconds is smaller than ten (for instance, seven as illustrated), then clock signal CLK has a slower oscillation frequency of 700 Hz. On the other hand, if the number of cycles within ten milliseconds is larger than ten (for instance, thirteen as illustrated), then clock signal CLK has a faster oscillation frequency of 1300 Hz.

By counting the number of cycles of clock signal CLK during a fixed time period (for example, during a pulse of the reference signal), the oscillation frequency of clock signal CLK can be calculated. However, this method introduces some measuring error. The number of cycles of clock signal CLK during the width of the reference pulse could be miscounted by up to one cycle because the reference signal and clock signal CLK are not synchronized. In the example of FIG. 4, up to ten percent measuring error may be introduced. In order to reduce the measuring error, the width of the reference pulse is generally long enough for timer 14 to count at least 500 cycles of clock signal CLK. In the example of FIG. 2, the target frequency is 5.5296 MHZ. The reference signal has a pulse width of 100 microseconds such that 553 cycles of clock signal CLK occur during the time period of 100 microseconds.

Timer 14 outputs a 16-bit number COUNT as the number of cycles of clock signal CLK. Processor 17 reads the digital value of COUNT and compares it with number 553 in step 45 of FIG. 3. If COUNT is initially smaller than 553, then the oscillation frequency of clock signal CLK is initially lower than the target frequency 5.5296 MHz. Processor 17 determines a new trim value and writes the new trim value into trim register 15 (step 46). The new trim value causes on-chip oscillator 13 to generate clock signal CLK with a higher oscillation frequency (step 43). Timer 14 then counts the number of cycles of clock signal CLK during the next pulse of the reference signal (step 44). Steps 43 through 46 are repeated during this frequency trimming process. The oscillation frequency of clock signal CLK is adjusted from pulse to pulse of the reference signal and is eventually calibrated to be substantially equivalent to the target frequency of 5.5296 MHz. Similarly, if COUNT is initially larger than 553, then the oscillation frequency of clock signal CLK is initially higher than the target frequency 5.5296 MHz. By repeating steps 43 through 46, the oscillation frequency of clock signal CLK is adjusted downward from pulse to pulse of the clock signal and is eventually calibrated and fixed with respect to the target frequency of 5.5296 MHz.

After the above frequency trimming process has been completed, final trim value 29 is saved (step 47) into a predetermined location of memory 18. Processor 17 also sends a DONE signal onto I/O terminal 24. Tester 12 receives the DONE signal. Test program 28 is erased in the final step 48. When microcontroller integrated circuit 11 is later powered up, processor 17 automatically reads final trim value 29 from the predetermined location of memory 18 and writes final trim value 29 into trim register 15. Final trim value 29 causes on-chip oscillator 13 to generate clock signal CLK with a frequency that is substantially equivalent to target frequency 5.5296 MHz.

Instead of using tester 12 to measure the frequency of clock signal CLK and to determine the final trim value, the frequency of clock signal CLK in FIG. 2 is internally trimmed within microcontroller integrated circuit 11. Processor 17 executes test program 28 and does the decision-making in the trimming process without involving tester 12. This internal frequency trimming method substantially reduces the calibration and test time of DUT 11. First, it is faster for processor 17 to execute test program 28 and do decision-making than tester 12. Second, the internal trimming method eliminates the need to transfer the 10-bit trim value between tester 12 and microcontroller integrated circuit 11 through serial communication. Third, serial port 27 of tester 12 is not occupied throughout the trimming process. Tester 12 is therefore able to perform other tests during the same time when the internal frequency trimming method is performed. Another advantage of this internal frequency trimming method is that tester 12 can be less expensive than an intelligent tester like the Teradyne J750 because tester 12 is no longer required to measure the frequency and do decision-making.

The frequency of clock signal CLK sometimes deviates significantly from the target frequency due to process variations involved in the manufacturing of on-chip oscillator 13. Under such a situation, it may be that the frequency cannot be calibrated with respect to the target frequency. Processor 17 sends a FAIL signal onto I/O terminal 25. Tester 12 receives the FAIL signal, causes test program 28 to be erased and continues with tests of other DUTs. By sending the FAIL signal, the total test time of DUT 11 is reduced because tester 12 does not have to wait for a longer time out period before continuing with other tests or the testing of other DUTs.

General purpose timer 14 is not always available in microcontroller integrated circuit 11. If it is not available, then a software program is implemented to measure the frequency of clock signal CLK in a similar way as timer 14. FIG. 5 illustrates an example of a software implementation of a frequency counter. In the example of FIG. 5, variable COUNT is reset to zero and incremented by one each time when clock signal CLK rises during a high pulse of the reference signal. Therefore, variable COUNT in this software pseudo code of FIG. 5 is usable in place of the 16-bit digital output COUNT of timer 14 of FIG. 2.

Although certain specific exemplary embodiments are described above in order to illustrate the invention, the invention is not limited to the specific embodiments. Accordingly, various modifications, adaptations, and combinations of various features of the described embodiments can be practiced without departing from the scope of the invention as set forth in the claims.

What is claimed is:

1. An integrated circuit comprising:
    a register;
    an on-chip oscillator that generates a clock signal internal to the integrated circuit, wherein a frequency of the clock signal is dependent upon a trim value stored in the register;
    a first terminal, wherein a reference signal is received onto the first terminal from a tester;
    a timer that generates a count of how many cycles of the clock signal occur during a period of time defined by the reference signal; and
    a processor that reads the count and based on the count changes the trim value in the register wherein the processor changes the trim value in the register by executing a test program that the integrated circuit receives from the tester.

2. The integrated circuit of claim 1, further comprising:
    a non-volatile memory, wherein the trim value is written into the non-volatile memory.

3. The integrated circuit of claim 1, further comprising:
    an on-chip debugger circuit that is coupled to a second terminal, wherein the tester serially loads the test program into the integrated circuit through the second terminal.

4. The integrated circuit of claim 1, further comprising:
    a memory that stores the test program, wherein execution of the test program causes the processor to read the count and to change the trim value based on the count such that the frequency of the clock signal is calibrated with respect to the reference signal.

5. The integrated circuit of claim 1, wherein the integrated circuit adjusts the frequency of the clock signal from pulse to pulse of the reference signal by executing a test program on the processor such that the frequency of the clock signal is calibrated with respect to the reference signal.

6. The integrated circuit of claim 1, wherein the integrated circuit adjusts the frequency of the clock signal based on the period of time defined by the reference signal.

7. The integrated circuit of claim 1, wherein the period of time defined by the reference signal is a pulse width of the reference signal.

8. The integrated circuit of claim 1, wherein the microcontroller integrated circuit includes an on-chip debugger circuit that is coupled to a debugger terminal, and wherein the tester serially loads the test program into the microcontroller integrated circuit through the debugger terminal.

9. The integrated circuit of claim 1, wherein the timer is a general purpose timer that is usable to time pulses received onto a second terminal of the integrated circuit.

10. A system, comprising:
a tester; and
a device-under-test (DUT), wherein the DUT is an integrated circuit comprising:
a terminal that receives a reference signal from the tester;
a register;
an on-chip oscillator that generates a clock signal internal to the DUT, wherein a frequency of the clock signal is dependent upon a trim value stored in the register;
a timer that generates a count of how many cycles of the clock signal occur during a period of time defined by the reference signal; and
a processor that reads the count and based on the count changes the trim value in the register wherein the processor changes the trim value in the register by executing a test program that the DUT receives from the tester.

11. The system of claim 10, wherein the DUT further comprises:
a non-volatile memory, wherein the trim value is written into the non-volatile memory.

12. The system of claim 10, wherein the DUT further comprises:
a memory that stores a test program, wherein execution of the test program causes the processor to change the trim value based on the count such that the frequency of the clock signal is calibrated with respect to the reference signal.

13. The system of claim 10, wherein the timer is a general purpose timer that is usable to time pulses received onto a second terminal of the DUT.

14. A system, comprising:
a tester; and
a device-under-test (DUT), wherein the DUT is an integrated circuit comprising:
a terminal that receives a reference signal from the tester;
a register;
an on-chip oscillator that generates a clock signal internal to the DUT, wherein a frequency of the clock signal is dependent upon a trim value stored in the register;
a timer that generates a count of how many cycles of the clock signal occur during a period of time defined by the reference signal; and
a processor that reads the count and based on the count changes the trim value in the register, wherein the processor executes a test program when the DUT is coupled to the tester and is receiving the reference signal from the tester, and wherein the test program is then erased while the DUT is still coupled to the tester.

15. An integrated circuit, comprising:
a first terminal, wherein a reference signal is received onto the first terminal from a tester;
a second terminal, wherein the tester serially loads a test program into the integrated circuit through the second terminal;
a register;
an on-chip oscillator that generates a clock signal internal to the integrated circuit, wherein a frequency of the clock signal is dependent upon a trim value stored in the register;
means for executing the test program such that the frequency of the clock signal is calibrated with respect to the reference signal; and a timer that generates a count of how many cycles of the clock signal occur during the period of time defined by the reference signal.

16. The integrated circuit of claim 15, wherein the means for executing the test program reads the count and based on the count changes the trim value in the register.

17. The integrated circuit of claim 15, wherein the means for executing the test program adjusts the frequency of the clock signal from pulse to pulse of the reference signal.

* * * * *